United States Patent
Park et al.

(10) Patent No.: US 11,888,288 B2
(45) Date of Patent: Jan. 30, 2024

(54) LASER DIODE DRIVER BREAK-DOWN PROTECTION SCHEME

(71) Applicant: MICROSOFT TECHNOLOGY LICENSING, LLC, Redmond, WA (US)

(72) Inventors: Chang Joon Park, Sunnyvale, CA (US); Martin Francis Galinski, Santa Clara, CA (US); Niranjan Achugundla Puttaswamy, San Jose, CA (US); Brandon Baxter Harris, San Jose, CA (US); Patrick Codd, Mountain Park, CA (US); Barry Thompson, Menlo Park, CA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 689 days.

(21) Appl. No.: 17/102,372

(22) Filed: Nov. 23, 2020

(65) Prior Publication Data
US 2022/0166188 A1 May 26, 2022

(51) Int. Cl.
*H01S 5/042* (2006.01)
*H02H 9/04* (2006.01)
*H03M 1/66* (2006.01)

(52) U.S. Cl.
CPC ............. *H01S 5/042* (2013.01); *H02H 9/045* (2013.01); *H03M 1/66* (2013.01)

(58) Field of Classification Search
CPC ...... H01S 5/042; H01S 5/06808; H02H 9/045
See application file for complete search history.

(56) References Cited

U.S. PATENT DOCUMENTS

| | | | |
|---|---|---|---|
| 2003/0117369 A1* | 6/2003 | Spitzer | G02F 1/13454 |
| | | | 257/E29.295 |
| 2004/0013352 A1* | 1/2004 | Khayim | G02B 6/4244 |
| | | | 385/24 |
| 2011/0228034 A1* | 9/2011 | Kyogoku | B41J 2/471 |
| | | | 372/38.02 |

* cited by examiner

*Primary Examiner* — Michael Carter
(74) *Attorney, Agent, or Firm* — Scott Y. Shigeta; Newport IP, LLC

(57) ABSTRACT

A system is provided for maintaining a safe operating area while also providing a suitable forward bias voltage to drive a laser diode. The system can monitor a voltage that is applied to a laser diode driver using a threshold that is based on the fabrication process of the laser diode driver. For example, a system can utilize a first threshold for a laser diode driver that is fabricated utilizing a 10 nm process and utilize a second threshold for another laser diode driver that is fabricated utilizing a 20 nm process. The threshold can also be based on a color of the laser or a desired operation mode. The system can monitor a voltage applied to a laser diode using different thresholds while controlling a bleed current to ensure that the laser diode is forward biased while mitigating the risk of silicon breakdown of the laser diode driver.

20 Claims, 5 Drawing Sheets

LASER DIODE DRIVER BREAK-DOWN PROTECTION SCHEME

BACKGROUND

Laser Diodes require a high forward bias voltage at the operating point of a high current condition for each color of lasers. Such requirements can push the limits of devices that are used to operate a laser diode. In some instances, devices that are used to operate a laser diode, such as a laser diode driver, can be associated with a safe operating area, and in some instances, the safe operating area can be based on a silicon fabrication process. For example, a laser diode driver that is fabricated with a 10 nanometer silicon fabrication process may be limited to a first maximum voltage, while a laser diode driver that is fabricated with a 20 nanometer silicon fabrication process may be limited to a another maximum voltage. If the voltage stress across the devices exceeds the safe operating area of the associated fabrication process, it will break down the devices and cause permanent damage.

While some existing systems are capable of providing a suitable forward bias voltage to drive a laser diode into an operating state, existing systems have a number of shortcomings. For example, some existing systems may not be configured to utilize multiple factors to safeguard a laser diode from operating conditions that can cause a silicon break down. In addition, although some existing circuits can monitor operating conditions of laser diodes, they are complex in nature and have reliability issues that are susceptible to temperature fluctuations and generally operate with poor efficiency levels. Given these shortcomings and a number of ongoing design challenges, there is a continual need to develop systems that can provide a high forward bias voltage for a laser diode while also providing safe, reliable, and efficient techniques for monitoring operating conditions of a laser diode.

SUMMARY

The disclosed techniques provide a number of technical benefits by providing a system that enables a circuit to remain in a safe operating area while also providing a suitable forward bias voltage to drive a laser diode. The system can monitor a voltage applied to a laser diode using different voltage thresholds to control a bleed current to ensure that the laser diode is forward biased while also mitigating the risk of silicon breakdown of the devices used to drive the laser diode.

In one illustrative example, a system can detect a peak voltage applied to an anode of a laser diode. If the system detects a peak voltage between the anode and a voltage source, e.g., VDD of a circuit, that exceeds a predetermined threshold voltage, the system can provide an input to a digital-to-analog converter that is controlling a bleed current applied to a laser diode to mitigate the breakdown of silicon of the devices of the system. In another illustrative example, a system can monitor a voltage between a cathode of a laser diode and another power terminal, e.g., a voltage source supply or ground of a circuit. When the voltage between a cathode of a laser diode and the other power terminal source exceeds a threshold, the system can provide an input to a digital-to-analog converter that is controlling a bleed current applied to a laser diode to mitigate the breakdown of silicon of the devices of the system. In any of the embodiments using a digital-to-analog circuit, the input to the digital-to-analog circuit can be modified by a digital circuit based on a color of the laser diode or a predetermined bleed current. In yet another example, a system can monitor a voltage between a cathode of a laser diode and another power terminal, e.g., VSS or ground. When the voltage between the cathode of a laser diode and the power terminal exceeds a threshold, the system can activate circuit comprising a bleed resister that is configured to control the bleed current applied to the laser diode to mitigate the breakdown of silicon of the devices of the system, such as a laser diode driver.

In some of the embodiments disclosed herein, the predetermined threshold voltage, also referred to herein as predetermined voltage, can be based on a safe operating area that is associated with a particular fabrication process or a preferred bleed current. A fabrication process referred to herein applies to specific rules on the minimum size and spacing features on each layer of a chip for a device or component of a system. For example, the system can utilize a first threshold voltage for 10 nm fabrication process for a device, such as a laser diode driver, or a second threshold voltage for a 20 nm fabrication process. The thresholds can be based on operating modes and diode types as well. For example, a third threshold for a desired bleed current for a particular color of a laser diode. These examples are provided for illustrative purposes and are not to be construed as limiting.

The disclosed adaptive bleed current control scheme optimizes the additional power consumption across the wide ambient temperature ranges, brightness levels, and different colors of the laser diodes. In terms of power efficiency and the board size, the disclosed techniques help reduce the formfactor and extend the battery life of handheld, wearable devices since select parts can be implemented in the integrated circuit. In addition, the disclosed techniques can enable a system to adaptively change a bleed current under various conditions. A number of technical benefits, including reliability and a reduced formfactor, can be realized by a system that can provide an adaptive bleed current control that can be implemented in the integrated circuit with and without the external components on a board.

Features and technical benefits other than those explicitly described above will be apparent from a reading of the following Detailed Description and a review of the associated drawings. This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter. The term "techniques," for instance, may refer to system(s), method(s), computer-readable instructions, module(s), algorithms, hardware logic, and/or operation(s) as permitted by the context described above and throughout the document.

BRIEF DESCRIPTION OF THE DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with a letter of a sequence of letters to refer to each individual item. Generic references to the items may use the specific reference number without the sequence of letters.

DETAILED DESCRIPTION

Figure 1:
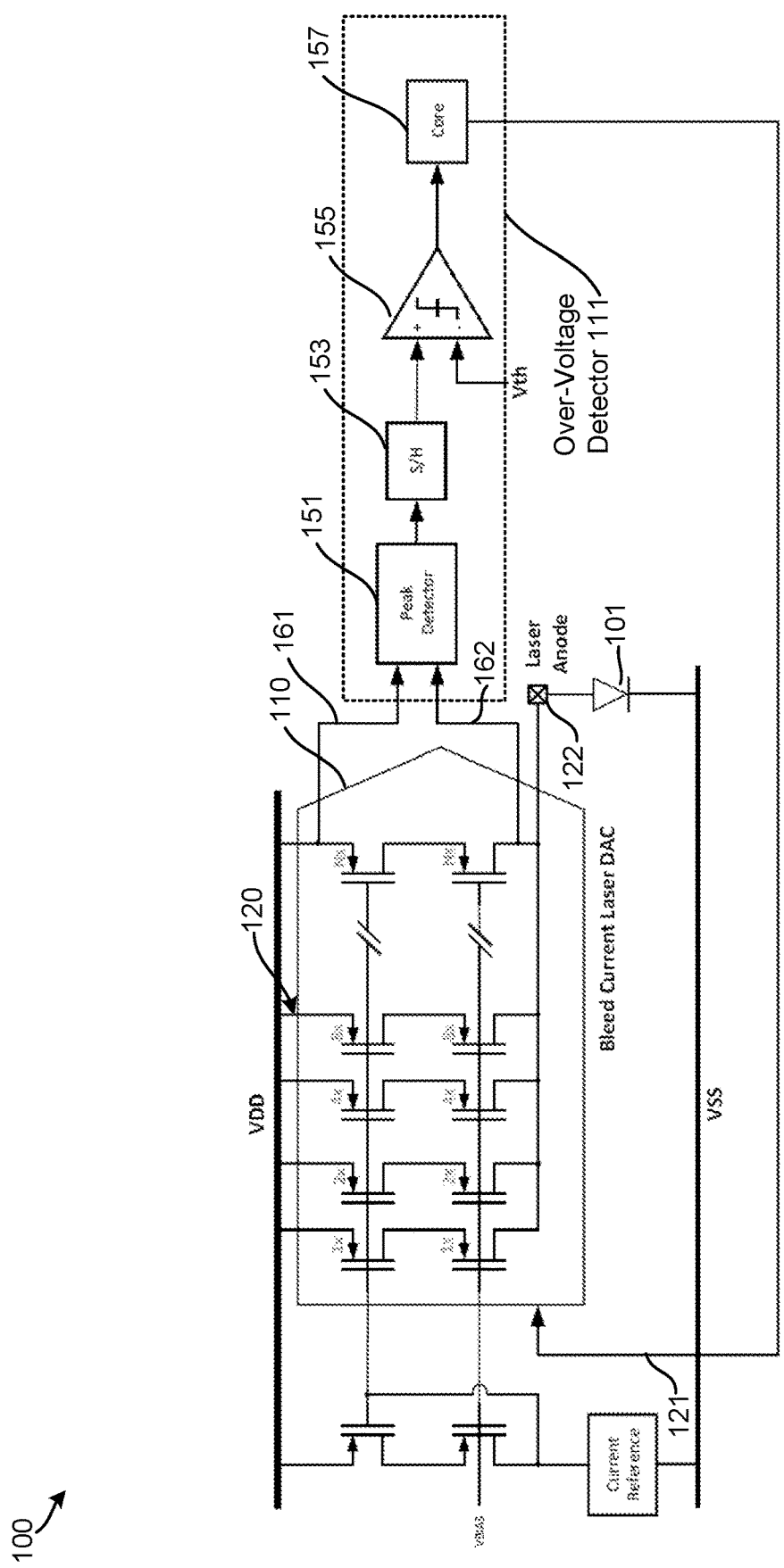
FIG. 1 is a block diagram of a system adapted to mitigate breakdown of silicon of a laser diode driver by varying a bleed current through the laser diode using peak voltage detector and a digital-to-analog converter.

FIG. 1 illustrates a system 100 adapted to mitigate breakdown of silicon of components of the system, such as current sources that are implemented with cascaded P-Type MOSFETs. The system mitigates the breakdown of silicon by controlling a bleed current through the laser diode 101. The system 100 includes a digital-to-analog converter 110 having a power terminal 120, a digital control input 121 and an output terminal 122. The power terminal 120 of the digital-to-analog converter 110 is coupled to a power source, such as a VDD. The output terminal 122 of the digital-to-analog converter 110 is coupled to an anode of the laser diode 101. The digital-to-analog converter 110 is configured to control the bleed current at output terminal 122 based on a digital input value provided at the digital control input 121. The bleed current can be supplied by the power source. The bleed current can be provided to the anode of the laser diode 101.

In one example, the digital-to-analog converter 110 comprises a number of current sources that are used to drive the laser diode 101 (also referred to herein as a "laser diode driver"), e.g., the top row of transistors, each that can be selectively activated by a switch, e.g., the bottom row of transistors. Each switch can be activated by a digital bit of a digital input of the digital-to-analog converter 110. Thus, a digital input of zero would cause the DAC 110 to produce little or no bleed current for the laser diode. However, a digital input of three would turn on two current sources within the digital-to-analog converter 110 to produce a controlled bleed current for the laser diode. This example is provided for illustrative purposes and is not to be construed as limiting. The laser diode driver can include any device or system component comprising any suitable current source used to drive the laser diode 101.

The system 100 can also include an overvoltage detector circuit 111 having a detector input configured to detect a peak voltage applied to the anode of the laser diode 101, wherein the overvoltage detector circuit 111 determines when a peak voltage exceeds a predetermined voltage. The predetermined voltage can be based on a given specification based on a fabrication process associated with the laser diode driver or other components of the system. For instance, the predetermined voltage, also referred to herein as a voltage threshold, can be one value for a laser diode driver made with a 10 nm technology, and other values suitable for a safe operating area of laser diode driver made with other technologies, e.g., 12 nm, 16 nm, 20 nm, etc. The predetermined voltage can also be based on other factors, such as a color of a laser diode or a preferred bleed level optimized for a particular use scenario or operating environment. For example, the predetermined voltage may be a first value for one color of the laser, and a second value for another color of the laser. In another examples, the predetermined voltage may be another value if a high bleed rate is desired, and yet another value if a low bleed rate is desired. The predetermined voltage or any other threshold voltage described herein can also be based on combinations of factors. For example, the predetermined voltage may be a given threshold voltage value or voltage range based on a particular color of a laser, a fabrication process, and/or a desired operating mode.

The overvoltage detector circuit 111 having an overvoltage output coupled to the digital control input 121, the overvoltage detector circuit 111 is configured to adjust the digital input value to increase or decrease the bleed current through the laser diode 101 in response to determining when the peak voltage exceeds the predetermined voltage. In one example, the digital input value can cause the digital-to-analog converter to decrease the bleed current in response to determining that the peak voltage exceeds the predetermined voltage. The circuitry can be provided for providing a current reference for the laser diode. In the embodiment shown in FIG. 1, the digital-to-analog converter 110, and the overvoltage detector circuit 111 can be part of an integrated circuit. Other embodiments may include other components and/or a subset of the components shown in FIG. 1 for an integrated circuit. Such embodiments can improve the cost and efficiency of the system.

The digital-to-analog converter shown in the FIGURES is also referred to herein as a bleed current laser digital-to-analog converter or a bleed current laser DAC. The bleed current laser DAC can be a part of a system that uses another DAC, also referred to an imaging DAC, for generating a signal for causing the laser diode to generate a light-based image. The bleed current laser DAC can work in concert with the imaging DAC to allow the imaging DAC to control the light emitted from the laser diode while the bleed current laser DAC controls the bleed current during certain time periods or during certain operating modes, e.g., when the imaging DAC is not in operation.

In some embodiments, the overvoltage detector circuit 111 can include a peak detector 151, a sample and hold device 153, a comparator 155 and a core circuit 157 for generating the digital input for the bleed current DAC 110. In general, the peak detector 151 can have first input 161 coupled to the power terminal 120 and the power source, such as the VDD supply. The peak detector can also have a second input 162 coupled to the output terminal 122 of the digital-to-analog converter 110 and the anode of the laser diode 101. The peak detector 151 can identify a new peak measured between the power source, e.g., VDD, and the anode of the laser diode. For example, if a voltage comprises a waveform signal, the peak of the waveform will be detected. The sample and hold device 153 can sample and hold the detected peak voltage. Thus, a new peak, e.g., detected peak voltage that is higher than a prior peak voltage, can be sampled and held in the device.

The comparator 155 can include any circuitry suitable for comparing one voltage to another voltage. Some configurations can include an operational amplifier (op amp) having an input for receiving a threshold voltage (Vth) and another input for receiving a detected peak voltage. The op amp can generate an output indicating when a peak voltage exceeds a predetermined threshold. The core circuit 157 can receive the output from the op amp, in response to a signal indicating that the peak voltage exceeds the predetermined threshold, the core circuit 157 can generate a signal at an output node for an input of the bleed current laser DAC. In some configurations, the output of the core circuit 157 can include a binary number, where each member of the binary number can be used to activate current switches within the bleed current laser DAC.

Figure 2:
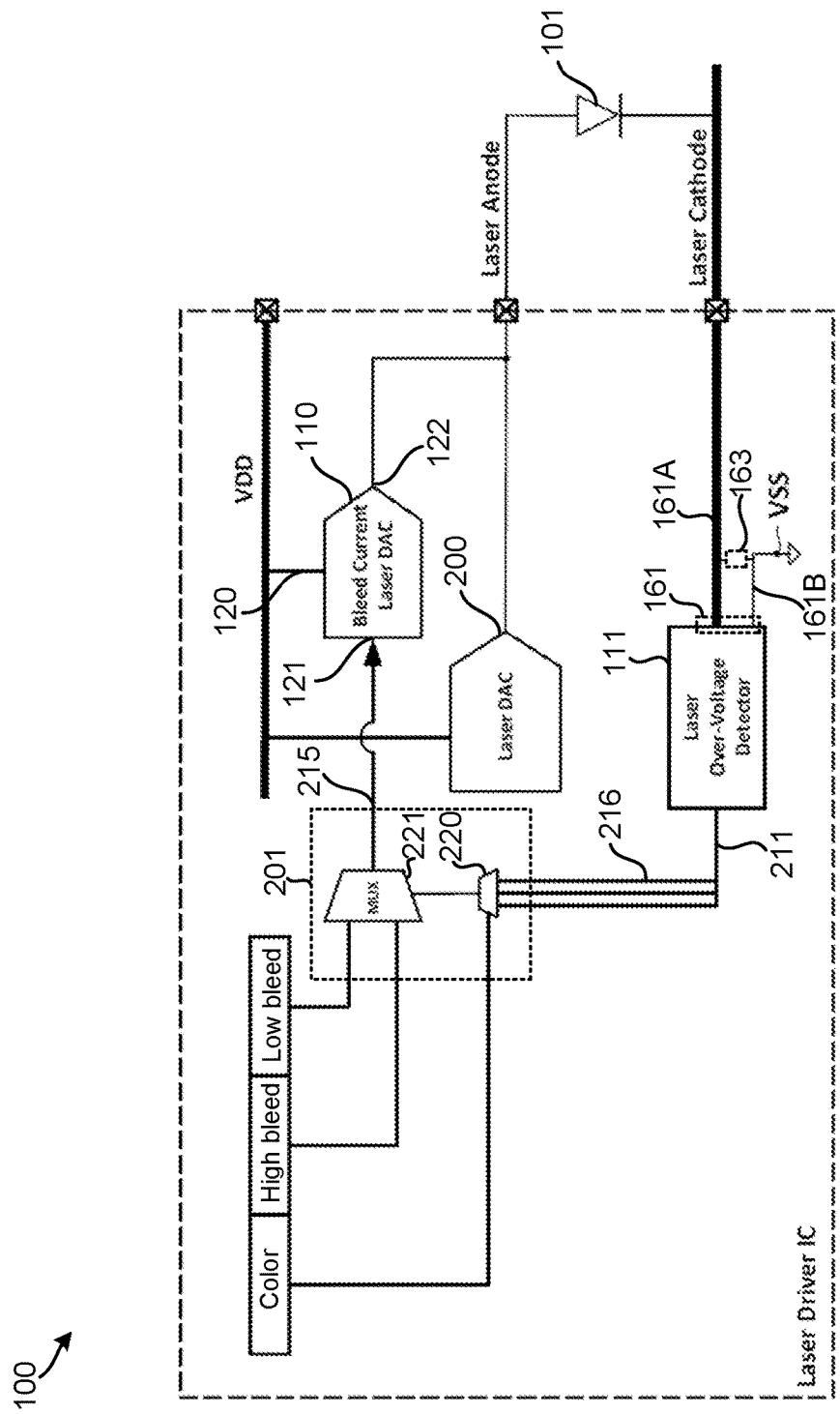
FIG. 2 is a block diagram of a system adapted to mitigate breakdown of silicon of a laser diode driver-by varying a bleed current through the laser diode using a digital-to-analog converter and a control circuit for adjusting a digital input to the converter based on a type of laser diode or based on a mode of operation.

Referring now to FIG. 2, a system block diagram shows another embodiment where a system is adapted to mitigate breakdown of silicon of a laser diode driver by varying a bleed current through the laser diode using a digital-to-analog converter. The system 100 is adapted to mitigate breakdown of silicon of a laser diode driver by varying a bleed current through the laser diode 101. The system 100 includes a digital-to-analog converter 110, an overvoltage detector circuit 111, and a control circuit 201. This embodiment also includes a control circuit 201 for adjusting a digital input to the converter based on a type of laser diode or based on a desired mode of operation. Also shown, the system can include an imaging DAC 200 for causing the laser diode to generate light to for an image display.

The digital-to-analog converter 110 can include a power terminal 120, a digital control input 121 and an output terminal 122, the power terminal 120 coupled to a power source (VDD), the output terminal 122 coupled to an anode of the laser diode 101. The digital-to-analog converter 110 is configured to control the bleed current through the laser diode based on a digital input provided at the digital control input 121. The bleed current is supplied by the power source and the bleed current is provided to the anode of the laser diode 101.

The overvoltage detector circuit 111 is configured with a detector input 161 configured to detect a voltage between the cathode of the laser diode 101 and a voltage source supply (VSS). The overvoltage detector circuit 111 determines when the voltage between the cathode and the voltage source supply (VSS) exceeds a predetermined voltage. In some configurations, the detector input 161 comprises a first terminal 161A and a second terminal 161B. The first terminal 161A is coupled to the cathode of the laser diode 101 and the second terminal 161B is coupled to the voltage source supply. In some configurations, the system can include a circuit 163 for enabling the system to produce a measurable voltage difference between the voltage source supply (VSS) node and the cathode of the laser diode. In one example, the circuit 163 between the voltage source supply (VSS) node and the cathode of the laser diode can be a resistor having a predetermined value for enabling measurement of a voltage difference between the cathode and the voltage source supply node.

The overvoltage detector circuit 111 also includes an overvoltage output 211 that is coupled to the digital control input 121 of the digital-to-analog converter 110 through a control circuit 201. The overvoltage detector circuit 111 is configured to adjust a first digital value at the overvoltage output 211. The overvoltage detector circuit 111 can increase or decrease the first digital value in response to determining that the voltage between the cathode of the laser diode and the voltage source supply (VSS) exceeds the predetermined voltage.

The control circuit 201 includes a digital output 215 coupled to the digital control input 121 and a digital input 216 coupled to the overvoltage output of the overvoltage detector circuit 111. The digital input 216 is configured to receive the first digital value from the overvoltage detector circuit 111. The control circuit is also configured to further adjust the first digital value generated by the overvoltage detector circuit 111 to generate a second digital value that is provided to the input 121 of the bleed laser DAC 110. The bleed laser DAC 110 can then modify the bleed current based on the second digital value. The modified bleed current is generated to mitigate breakdown of silicon of a laser diode driver, e.g., keep current supplied to the laser diode to guarantee a preferred operation condition of a laser diode driver. The control circuit 201 adjusts the first digital value to generate the second digital value based on a type of laser diode or based on a mode of operation. The second digital value causes the digital-to-analog converter (110) to modify the bleed current through the laser diode. By the use of the control circuit 201, the system can adjust the bleed current to accommodate different types of laser diodes, e.g., different colors and/or different brightness levels. The control circuit 201 also enables the system to adjust the bleed current to accommodate different types of preference setting indicating a bleed high level or a low bleed level. In the embodiment shown in FIG. 2, each of the components in the dashed line box can be part of an integrated circuit. Other embodiments may include a subset of the displayed components for an integrated circuit. Such embodiments can improve the cost and efficiency of the system.

In one example, when the voltage between the cathode of the laser diode and the voltage source supply (VSS) exceeds the predetermined voltage the overvoltage detector circuit 111 can decrease the first digital value. This decreased number can then be provided to the control circuit 201, which in turn, increases or decreases the first digital value to generate a second digital value. For example, a type of laser diode can be associated with a fabrication process or a color of the laser light generated by the laser diode. For instance, if data provided to a first multiplexer 220 of the control circuit 201 indicates that the laser diode is a particular color, e.g., red, blue or green, the first multiplexer 220 may increase or decrease the first digital value to generate a second digital value. Then, if data provided to a second multiplexer 221 of the control circuit 201 indicates a mode of operation, e.g., a bleed current above a current threshold ("high bleed level") or a bleed current below a current threshold ("low bleed level"), the second multiplexer 220 may cause a further increases or decreases the first digital value to generate the second digital value that is provided to the bleed laser DAC.

Figure 3A:
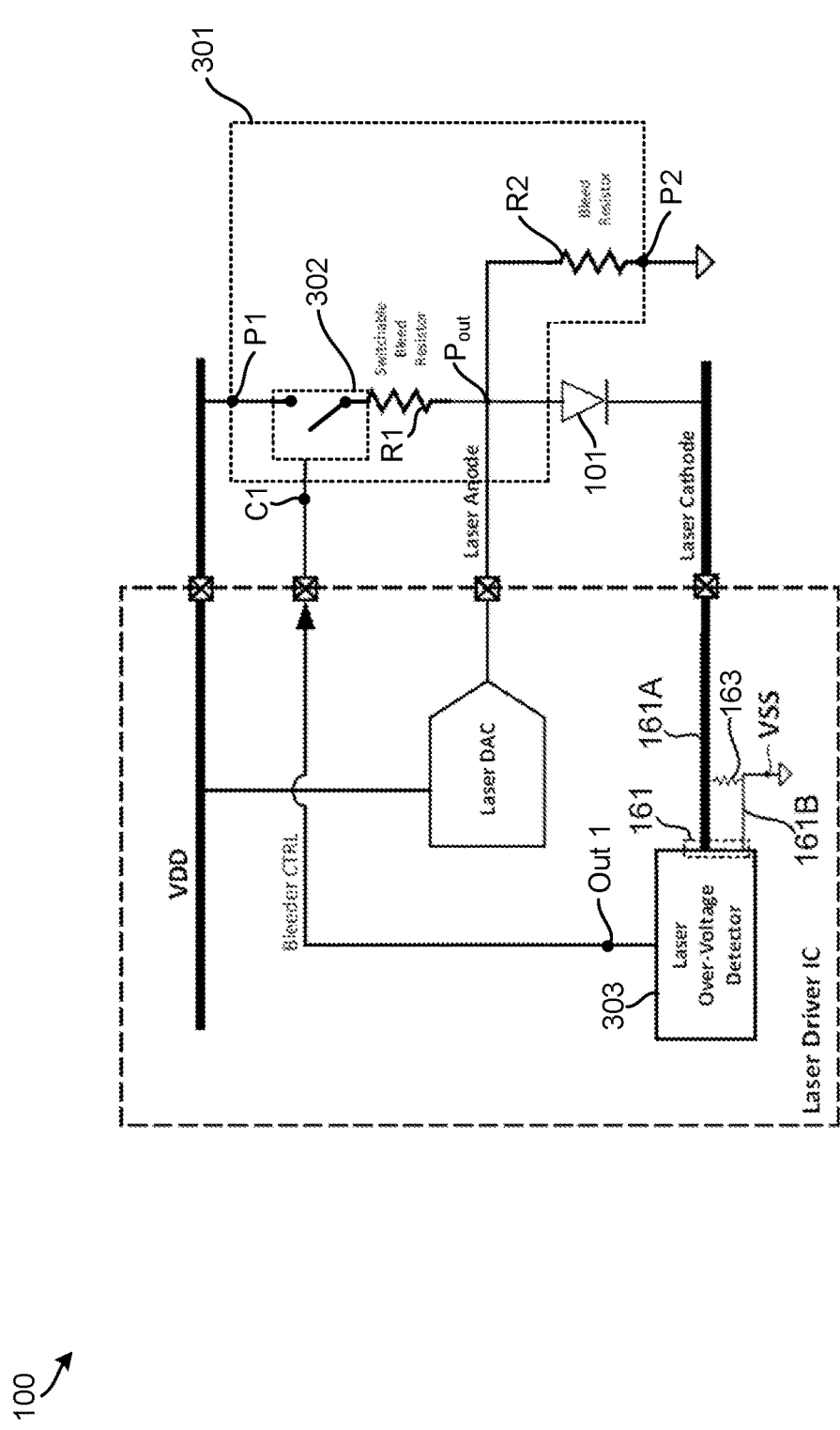
FIG. 3A is a block diagram of a system adapted to mitigate breakdown of silicon of a laser diode driver-by controlling a bleed current through the laser diode using a bleed resistor circuit that is controlled by a voltage detector.

FIG. 3A is a block diagram of a system adapted to mitigate breakdown of silicon of a laser diode driver by varying a bleed current through the laser diode 101 using a bleed resistor circuit 301 that is controlled by a voltage detector 303. In this example, the system 100 includes a bleed resistor circuit 301 and a overvoltage detector circuit 303. In some embodiments, as shown in the bolded dashed lines, the overvoltage detector circuit 303 can be part of an integrated circuit having an imaging DAC for driving the laser diode.

The bleed resistor circuit 301 can include a switch control input C1, a first power input P1, a second power input P2, and a power output ($P_{out}$). The first power input P1 coupled to a first voltage source VDD, the second power input P2 coupled to a supply terminal, e.g., ground or a negative voltage source, and the power output ($P_{out}$) coupled to an anode of the laser diode 101. The bleed resistor circuit 301 is configured to control the bleed current through the laser diode 101 when a control signal received at the switch control input (C1) is activated. The supply terminal can also be referred to herein as a voltage source supply, e.g., VSS, which can be at a voltage less than the first voltage source VDD.

The overvoltage detector circuit 303 includes a detector input 161 configured to determine when a voltage between a cathode of the laser diode 101 and a voltage source supply (VSS) exceeds a predetermined voltage. The predetermined voltage can be based on any of the factors described herein such as the type of laser diode, etc. The overvoltage detector circuit 303 Also includes an overvoltage output (Out 1), the overvoltage detector circuit 303 is configured to activate the control signal that is communicated from the overvoltage output (Out 1) to the switch control input C1 in response to determining that the voltage between the cathode of the laser diode 101 and the voltage source supply VSS exceeds a predetermined voltage. The activation of the control signal causes a switch 302 of the bleed resister circuit 301 to selectively couple the first voltage source (VDD) and the anode of the through one or more resistors to control the bleed current through the laser diode 101 for mitigating silicon breakdown of a laser diode driver.

The overvoltage detector circuit 111 is configured with a detector input 161 configured to detect a voltage between the cathode of the laser diode 101 and a voltage source supply (VSS). The overvoltage detector circuit 111 determines when the voltage between the cathode and the voltage source supply (VSS) exceeds a predetermined voltage and activates the output (Out 1) when such as condition is detected. In some configurations, the detector input 161 comprises a first terminal 161A and a second terminal 161B. The first terminal 161A is coupled to the cathode of the laser diode 101 and the second terminal 161B is coupled to the voltage source supply. In some configurations, the system can include a circuit 163, which can be in the form of one or more resistors having a predetermined value for enabling a measurement of a voltage difference between the cathode and the voltage source supply node.

Figure 3B:
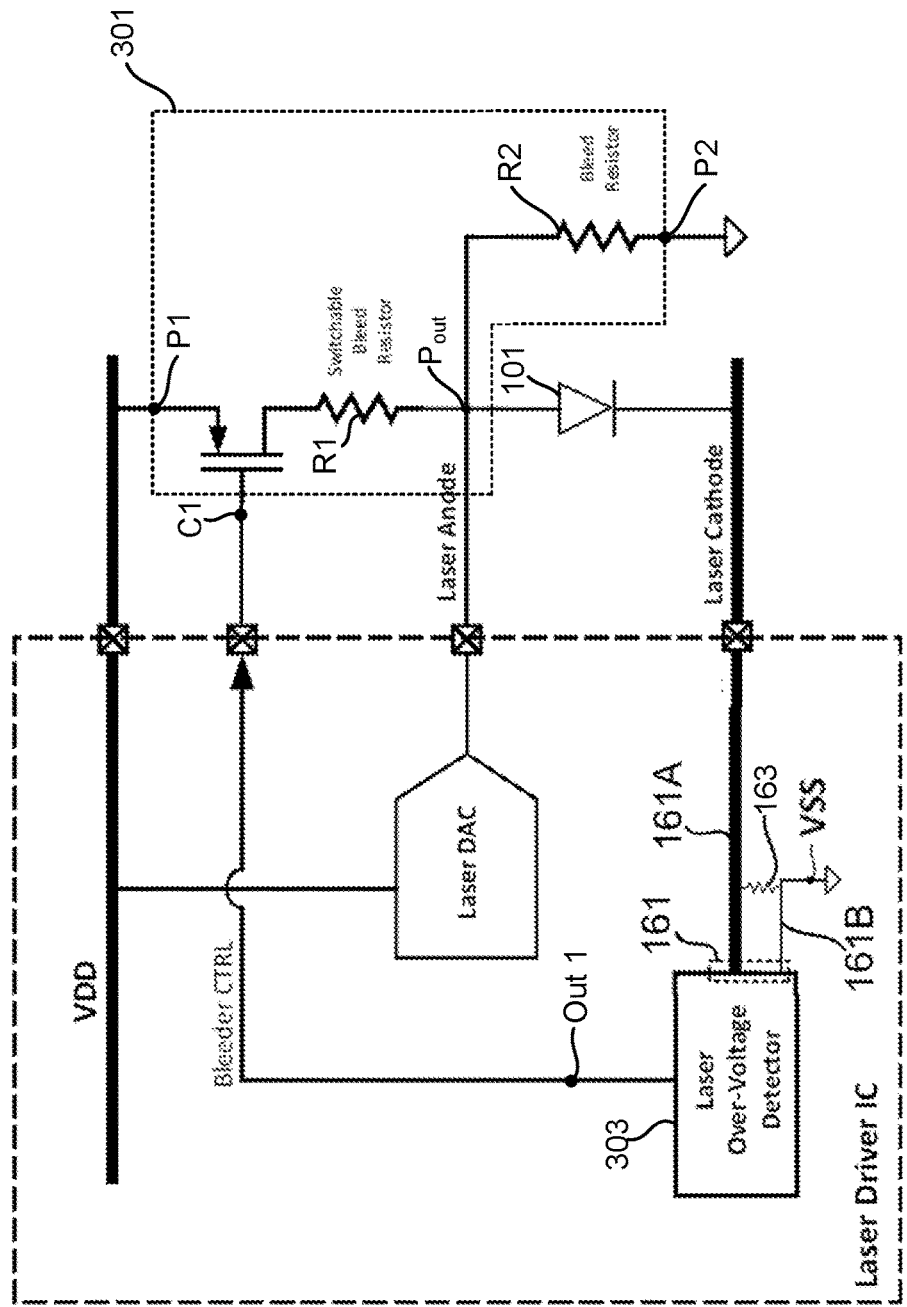
FIG. 3B is a block diagram of the system shown in FIG. 3A where a switch of the bleed resistor circuit comprises a MOSFET transistor.

In one example, the bleed resister circuit 301 can include a switch 302 for selectively coupling the first voltage source (VDD) to a first conductor of a first resistor (R1). The second conductor of the resistor (R1) being coupled to the anode of the laser diode 101. The bleed resister circuit 301 also includes a second resistor (R2), where a first conductor of the second resistor (R2) is coupled to the anode of the laser diode 101, and the second conductor of the second resistor (R2) is coupled to the voltage source supply VSS. The values of each resistor can be any suitable value to function as a voltage divider to increase or reduce the bleed current that passes through the laser diode when the switch is activated. In one embodiment, the values of each resistor can be any suitable value having a ratio that causes the bleed current to be reduced through the laser diode. In another embodiment, the values of each resistor can be any suitable value having a ratio that causes the bleed current to be increased through the laser diode. FIG. 3B shows an embodiment where the switch 302 comprises a transistor having a gate, source, and drain respectively coupled to the control input C1, the first voltage source, and the voltage source supply.

As described above, if a detected voltage, e.g., an anode voltage versus one or more voltage sources, or a cathode voltage versus one or more voltage sources or a voltage supply, is higher than the threshold, the current bleed laser DAC controls how much current is delivered to the laser diode with a pre-programmed bleed laser current. A number of characteristics of the system can depends on the ambient temperature of the system and thus cause the forward voltage of the laser diode to fluctuate. Therefore, the bleed current DAC can have multi-bits resolution for a fine optimization to save the power consumption. Since the SOA limit is different with the fabrication process and the positive power supply for laser diode driver is determined, the negative supply for Laser Diode which is connected to the cathode of Laser Diode can be used for laser diode overvoltage detection. The techniques disclosed herein also allow for many different scenarios. For instance, depending on a detected voltage level at the laser diode, the amount of the bleed current is selected through multiplexer that is injected to Laser Diode for ensuring the forward bias condition for the laser diode. Also, as described herein, the bleed current can be provided by the Off-Chip bleed resistors depending on the detected information using the peak detector or laser over-voltage detector. The techniques disclosed herein also provide an adaptive bleed laser current under wide ambient temperature operating ranges. Because the forward voltage of laser diodes varies on the colors, the fixed amount of bleed current with the external passive elements is easily over compensated and consumes the excessive power. However, the techniques disclosed herein also provide an adaptive scheme that can minimize the overall power consumption.

Figure 4:
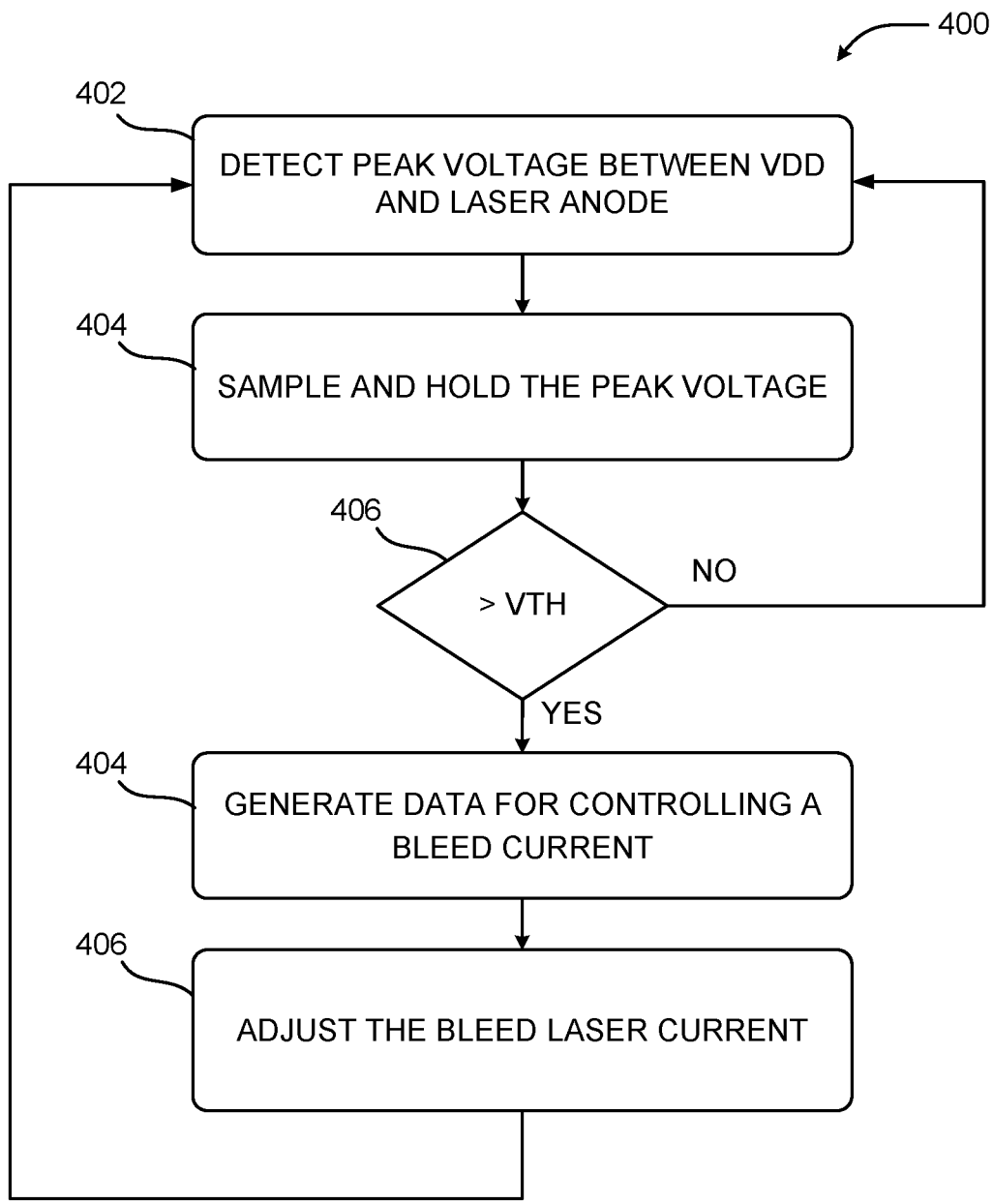
FIG. 4 is a flow diagram showing aspects of a routine used by a system adapted to mitigate breakdown of silicon of a laser diode driver-by varying a bleed current through the laser diode using peak voltage detector and a digital-to-analog converter.

FIG. 4 is a flow diagram showing aspects of a routine 400 used by a system adapted to mitigate breakdown of silicon of a laser diode driver by varying a bleed current through the laser diode using peak voltage detector and a digital-to-analog converter. This routine can apply to the embodiments represented by the example of FIG. 1. The routine 400 starts at operation 402 where the peak detector 151 determines a peak voltage between a power source, such as the VDD and the anode of the laser diode 101. The peak detector 151 can identify a new peak measured between the power source, e.g., VDD, and the anode of the laser diode. For example, if a voltage comprises a waveform signal, the peak of the waveform will be detected, and a peak voltage can be detected. Next, at operation 404, the sample and hold device 153 can sample and hold the detected peak voltage. Thus, a new peak, e.g., detected peak voltage that is higher than a prior peak voltage, can be sampled and held in the device. Next, at operation 406, the comparator 155 can compare one voltage to another voltage, such as a detected peak voltage versus a predetermined threshold. For example, if the detected peak voltage at the anode of a laser diode exceeds a predetermined threshold, the routine can proceed to operation 406 where the system, e.g., using logic circuits, can generate data, such as a digital value, for controlling the laser bleed DAC to change a bleed current for the laser diode. If the detected peak voltage at the anode of a laser diode does not exceed a predetermined threshold, the routine can return back to operation 402 where another voltage is measured.

For operation 404, the core circuit 157 can receive the output from the op amp and generate data, such as a digital value, for controlling the laser bleed DAC to adjust a bleed current for the laser diode. The digital value can vary based on the detected peak voltage or the digital value can be based on a difference between the peak anode voltage and the threshold. The digital value can be higher or it can increase with an iteration of the routine 400 when the peak anode voltage has increased, or when the difference between the peak anode voltage and the threshold increases from a prior iteration of the routine. The digital value can be lower or it can be reduced with an iteration of the routine 400 when the peak anode voltage has decreased or when the difference between the peak anode voltage and the threshold decreases from a prior iteration of the routine. In some configurations, the output of the core circuit 157 can include a binary number, where each member of the binary number can be used to activate current switches within the bleed current laser DAC.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means a direct electrical connection between the items connected, or an indirect connection through one or more passive or active intermediary devices and/or components. The terms "circuit" and "component" means either a single component or a multiplicity of components, either active and/or passive, that are coupled to provide a desired function. The term "signal" means at least a wattage, current, voltage, or data signal. The terms, "gate," "drain," and "source," can also mean a "base," "collector" and "emitter," and/or equivalent parts.

The disclosure presented herein may be considered in view of the following example clauses:

Example Clause 1: A system (100) adapted to mitigate breakdown of silicon of a laser diode driver by varying a bleed current through the laser diode (101), the system (100) comprising: digital-to-analog converter (110) having a power terminal (120), a digital control input (121) and an output terminal (122), the power terminal (120) coupled to a power source (VDD), the output terminal (122) coupled to an anode of the laser diode (101), the digital-to-analog converter (110) configured to control the bleed current at output terminal (122) based on a digital input value provided at the digital control input (121), the bleed current being supplied by the power source and provided to the anode of the laser diode (101); and an overvoltage detector circuit (111) having a detector input configured to detect a peak voltage applied to the anode of the laser diode (101), wherein the overvoltage detector circuit (111) determines when a peak voltage exceeds a predetermined voltage, the overvoltage detector circuit (111) having an overvoltage output coupled to the digital control input (121), the overvoltage detector circuit (111) is configured to adjust the digital input value to cause the digital-to-analog converter (110) to increase or decrease the bleed current through the laser diode (101) in response to determining when the peak voltage exceeds the predetermined voltage.

Example Clause 2: The system of clause 1, wherein the increase or the decrease of the bleed current through the laser is to maintain the laser diode in a safe operating area that is associated with the predetermined voltage, the predetermined voltage being based on at least one of a color of the laser diode, a fabrication process of the laser diode driver, or a preferred operating mode.

Example Clause 3: The system of clauses 1 and 2, wherein the increase or the decrease of the bleed current through the laser is to maintain the laser diode in a safe operating area that is associated with the predetermined voltage, wherein the predetermined voltage is based on a type of laser diode, wherein the type of laser diode is based on a color of a laser light emitted from the laser diode.

Example Clause 4: The system of clauses 1 through 3, wherein the increase or the decrease of the bleed current through the laser is to maintain the laser diode in a safe operating area that is associated with the predetermined voltage, wherein the predetermined voltage is based on a type of laser diode, wherein the type of laser diode indicates a fabrication process used to determine size and spacing features of silicon of the laser diode driver.

Example Clause 5: The system of clauses 1 through 4, wherein the increase or the decrease of the bleed current through the laser is to maintain the laser diode in a safe operating area that is associated with the predetermined voltage, wherein the predetermined voltage is based on a preferred operating mode, wherein the preferred operating mode indicates that the bleed current is to be maintained above a threshold current or that the bleed current is to be maintained below the threshold current.

Example Clause 6: The system of clauses 1 thorough 5, wherein the overvoltage detector circuit comprises a peak detector, a sample and hold device, a comparator, and a core circuit, wherein the peak detector is configured to monitor a voltage at the anode of the laser diode, wherein the peak detector and the sample and hold device are configured to determine when the voltage at the anode of the laser diode has reached the peak voltage, in response to determining when the voltage at the anode of the laser diode has reached the peak voltage, sending a value indicating the peak voltage to the comparator, wherein the comparator determines if the peak voltage is greater than the predetermined voltage, the comparator and the core circuit configured to generate a digital input value for controlling the bleed current.

Example Clause 7: The system of clauses 1 through 6, further comprising an imaging digital-to-analog converter for causing the laser diode to generate a light-based image, wherein the digital-to-analog converter concurrently operates with the imaging digital-to-analog converter to cause the laser diode to generate an image while operating in a safe operating area.

Example Clause 8: A system (100) adapted to mitigate breakdown of silicon of a laser diode driver by varying a bleed current through the laser diode (101), the system (100) comprising: a digital-to-analog converter (110) having a power terminal (120), a digital control input (121) and an output terminal (122), the power terminal (120) coupled to a power source (VDD), the output terminal (122) coupled to an anode of the laser diode (101), the digital-to-analog converter (110) configured to control the bleed current at output terminal (122) based on a digital value provided at the digital control input (121), the bleed current being supplied by the power source and the bleed current being provided to the anode of the laser diode (101); an overvoltage detector circuit (111) having a detector input configured to determine when a voltage between a cathode of the laser diode (101) and a voltage source supply (VSS) exceeds a predetermined voltage, the overvoltage detector circuit (111) having an overvoltage output, the overvoltage detector circuit (111) is configured to adjust a first digital value that configured to increase or decrease the first digital value in response to determining when the voltage between the cathode of the laser diode and the voltage source supply (VSS) exceeds the predetermined voltage; and a control circuit (201) having a digital output coupled to the digital control input (121) of the digital-to-analog converter (110) and the control circuit having a digital input coupled to the overvoltage output of the overvoltage detector circuit (111), the digital input for receiving the first digital value, the control circuit configured to further adjust the first digital value to generate a second digital value, wherein the adjustment to the first digital value to generate the second digital value is based on a type of laser diode or based on an operating mode of the system, wherein the second digital value causes the digital-to-analog converter (110) to control the bleed current through the laser diode to maintain the laser diode in a safe operating area that is associated with the predetermined voltage.

Example Clause 9: The system of clause 8, wherein the type of the laser diode includes at least one of a fabrication process associated with the laser diode driver or a color of a laser light emitted from the laser diode, wherein the first digital value is adjusted to the second digital value based on the fabrication process associated with the laser diode driver or the color of the laser light emitted from the laser diode.

Example Clause 10: The system of clauses 8 and 9, wherein the operating mode indicates that the bleed current is to be maintained above a threshold current or that the bleed current is to be maintained below the threshold current, wherein the first digital value is adjusted to the second digital value based on the operating mode indicating that the bleed current is to be maintained above the threshold current or that the bleed current is to be maintained below the threshold current.

Example Clause 11. The system of clauses 8 through 10, wherein the type of the laser diode includes a fabrication process associated with the laser diode driver, wherein the first digital value is adjusted to the second digital value based on the fabrication process associated with the laser diode driver, wherein the fabrication process indicates size and spacing features of silicon of the laser diode driver.

Example Clause 12: The system of clauses 8 through 11, wherein in the control circuit comprises one or more multiplexers for receiving device data indicating that the laser diode is configured to emit light having a particular color, wherein the one or more multiplexers increase or decrease the first digital value to generate the second digital value based on data indicating that the laser diode is configured to emit light having the particular color.

Example Clause 13: The system of clauses 8 through 12, wherein in the one or more multiplexers receive operating data indicating the operating mode, wherein the one or more multiplexers increase or decrease the first digital value to generate the second digital value based on operating data indicating a first operating mode that maintains the bleed current above a current threshold or indicating a second operating mode that maintains the bleed current below the current threshold.

Example Clause 14: The system of clauses 8 through 13, wherein the cathode of the laser diode is coupled to the voltage source supply through a resistor having a predetermined resistance value for providing a voltage at the cathode versus the voltage source supply.

Example Clause 15: A system (100) adapted to mitigate silicon breakdown of a laser diode driver by controlling a bleed current through the laser diode (101), the system (100) comprising: a bleed resistor circuit (301) having a switch control input (C1), a first power input (P1) coupled to a first voltage source (VDD), a second power input (P2) coupled to a voltage source supply (VSS), and a power output (Pout) coupled to an anode of the laser diode (101), the bleed resistor circuit (301) configured to control the bleed current through the laser diode (101) when a control signal received at the switch control input (C1) is activated; and an overvoltage detector circuit (303) having a detector input 161 configured to determine when a voltage between a cathode of the laser diode (101) and the voltage source supply (VSS) exceeds a predetermined voltage, the overvoltage detector circuit (303) having an overvoltage output (Out 1), the overvoltage detector circuit (111) is configured to activate the control signal that is communicated from the overvoltage output (Out 1) to the switch control input (C1) in response to determining that the voltage between a cathode of the laser diode (101) and a voltage source supply (VSS) exceeds a predetermined voltage difference, wherein activation of the control signal causes a switch (302) of the bleed resister circuit to selectively couple the first voltage source and the anode of the diode (101) through one or more resistors that control the bleed current through the laser diode (101) for mitigating silicon breakdown of the laser diode driver.

Example Clause 16: The system of clause 15, wherein the bleed resistor circuit comprises a transistor, a first bleed resistor, and a second bleed resistor, the transistor having a gate, a source, and a drain, wherein the gate functions as the control input, the source coupled to the first voltage source, the drain coupled to a first contact of a first resistor, wherein a second contact of the first resistor is coupled to the anode of the laser diode, the second contact of the first resistor is also coupled to a first contact of a second resistor, wherein a second contact of the second resistor is coupled to the voltage source supply, wherein the first resistor and the second resistor have resistance values for controlling the bleed current through the laser diode to a predetermined current range when the control signal is activated by the overvoltage detector circuit.

Example Clause 17: The system of clauses 15 and 16, wherein the predetermined voltage difference is based on at least one of a color of the laser diode, a fabrication process of the laser diode driver, or a preferred operating mode.

Example Clause 18: The system of clauses 15 through 17, wherein the predetermined voltage difference is based on a type of laser diode, wherein the type of laser diode is based on a color of a laser light emitted from the laser diode.

Example Clause 19: The system of clauses 15 through 18, wherein the predetermined voltage difference is based on a type of laser diode, wherein the type of laser diode indicates a fabrication process used to determine size and spacing features of silicon of the laser diode driver.

Example Clause 20: The system of clauses 15 through 19, wherein the predetermined voltage difference is based on an operating mode indicating that the bleed current is to be maintained above the threshold current or that the bleed current is to be maintained below the threshold current.

In closing, although the various configurations have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

We claim:

1. A system adapted to mitigate breakdown of silicon of a laser diode driver by varying a bleed current through the laser diode, the system comprising:
   a digital-to-analog converter having a power terminal, a digital control input and an output terminal, the power terminal coupled to a power source, the output terminal coupled to an anode of the laser diode, the digital-to-analog converter configured to control the bleed current at output terminal based on a digital input value provided at the digital control input, the bleed current being supplied by the power source and provided to the anode of the laser diode; and
   an overvoltage detector circuit having a detector input configured to detect a peak voltage applied to the anode of the laser diode, wherein the overvoltage detector circuit determines when a peak voltage exceeds a predetermined voltage, the overvoltage detector circuit having an overvoltage output coupled to the digital control input, the overvoltage detector circuit is configured to adjust the digital input value to cause the digital-to-analog converter to increase or decrease the bleed current through the laser diode in response to determining when the peak voltage exceeds the predetermined voltage.

2. The system of claim 1, wherein the increase or the decrease of the bleed current through the laser is to maintain the laser diode in a safe operating area that is associated with the predetermined voltage, the predetermined voltage being based on at least one of a color of the laser diode, a fabrication process of the laser diode driver, or a preferred operating mode.

3. The system of claim 1, wherein the increase or the decrease of the bleed current through the laser is to maintain the laser diode in a safe operating area that is associated with the predetermined voltage, wherein the predetermined voltage is based on a type of laser diode, wherein the type of laser diode is based on a color of a laser light emitted from the laser diode.

4. The system of claim 1, wherein the increase or the decrease of the bleed current through the laser is to maintain the laser diode in a safe operating area that is associated with the predetermined voltage, wherein the predetermined voltage is based on a type of laser diode, wherein the type of laser diode indicates a fabrication process used to determine size and spacing features of silicon of the laser diode driver.

5. The system of claim 1, wherein the increase or the decrease of the bleed current through the laser is to maintain the laser diode in a safe operating area that is associated with the predetermined voltage, wherein the predetermined voltage is based on a preferred operating mode, wherein the preferred operating mode indicates that the bleed current is to be maintained above a threshold current or that the bleed current is to be maintained below the threshold current.

6. The system of claim 1, wherein the overvoltage detector circuit comprises a peak detector, a sample and hold device, a comparator, and a core circuit, wherein the peak detector is configured to monitor a voltage at the anode of the laser diode, wherein the peak detector and the sample and hold device are configured to determine when the voltage at the anode of the laser diode has reached the peak voltage, in response to determining when the voltage at the anode of the laser diode has reached the peak voltage, sending a value indicating the peak voltage to the comparator, wherein the comparator determines if the peak voltage is greater than the predetermined voltage, the comparator and the core circuit configured to generate the digital input value for controlling the bleed current.

7. The system of claim 1, further comprising an imaging digital-to-analog converter for causing the laser diode to generate a light-based image, wherein the digital-to-analog converter concurrently operates with the imaging digital-to-analog converter to cause the laser diode to generate an image while operating in a safe operating area.

8. A system adapted to mitigate breakdown of silicon of a laser diode driver by varying a bleed current through the laser diode, the system comprising:
a digital-to-analog converter having a power terminal, a digital control input and an output terminal, the power terminal coupled to a power source, the output terminal coupled to an anode of the laser diode, the digital-to-analog converter configured to control the bleed current at output terminal based on a digital value provided at the digital control input, the bleed current being supplied by the power source and the bleed current being provided to the anode of the laser diode;
an overvoltage detector circuit having a detector input configured to determine when a voltage between a cathode of the laser diode and a voltage source supply exceeds a predetermined voltage, the overvoltage detector circuit having an overvoltage output, the overvoltage detector circuit is configured to adjust a first digital value that configured to increase or decrease the first digital value in response to determining when the voltage between the cathode of the laser diode and the voltage source supply exceeds the predetermined voltage; and
a control circuit having a digital output coupled to the digital control input of the digital-to-analog converter and the control circuit having a digital input coupled to the overvoltage output of the overvoltage detector circuit, the digital input for receiving the first digital value, the control circuit configured to further adjust the first digital value to generate a second digital value, wherein the adjustment to the first digital value to generate the second digital value is based on a type of laser diode or based on an operating mode of the system, wherein the second digital value causes the digital-to-analog converter to control the bleed current through the laser diode to maintain the laser diode in a safe operating area that is associated with the predetermined voltage.

9. The system of claim 8, wherein the type of the laser diode includes at least one of a fabrication process associated with the laser diode driver or a color of a laser light emitted from the laser diode, wherein the first digital value is adjusted to the second digital value based on the fabrication process associated with the laser diode driver or the color of the laser light emitted from the laser diode.

10. The system of claim 8, wherein the operating mode indicates that the bleed current is to be maintained above a threshold current or that the bleed current is to be maintained below the threshold current, wherein the first digital value is adjusted to the second digital value based on the operating mode indicating that the bleed current is to be maintained above the threshold current or that the bleed current is to be maintained below the threshold current.

11. The system of claim 8, wherein the type of the laser diode includes a fabrication process associated with the laser diode driver, wherein the first digital value is adjusted to the second digital value based on the fabrication process associated with the laser diode driver, wherein the fabrication process indicates size and spacing features of silicon of the laser diode driver.

12. The system of claim 8, wherein in the control circuit comprises one or more multiplexers for receiving device data indicating that the laser diode is configured to emit light having a particular color, wherein the one or more multiplexers increase or decrease the first digital value to generate the second digital value based on data indicating that the laser diode is configured to emit light having the particular color.

13. The system of claim 12, wherein in the one or more multiplexers receive operating data indicating the operating mode, wherein the one or more multiplexers increase or decrease the first digital value to generate the second digital value based on operating data indicating a first operating mode that maintains the bleed current above a current threshold or indicating a second operating mode that maintains the bleed current below the current threshold.

14. The system of claim 8, wherein the cathode of the laser diode is coupled to the voltage source supply through a resistor having a predetermined resistance value for providing a voltage at the cathode versus the voltage source supply.

15. A system adapted to mitigate silicon breakdown of a laser diode driver by controlling a bleed current through the laser diode, the system comprising:
   a bleed resistor circuit having a switch control input, a first power input coupled to a first voltage source, a second power input coupled to a voltage source supply, and a power output coupled to an anode of the laser diode, the bleed resistor circuit configured to control the bleed current through the laser diode when a control signal received at the switch control input is activated; and
   an overvoltage detector circuit having a detector input 161 configured to determine when a voltage between a cathode of the laser diode and the voltage source supply exceeds a predetermined voltage, the overvoltage detector circuit having an overvoltage output, the overvoltage detector circuit is configured to activate the control signal that is communicated from the overvoltage output to the switch control input in response to determining that the voltage between a cathode of the laser diode and a voltage source supply exceeds a predetermined voltage difference, wherein activation of the control signal causes a switch of the bleed resister circuit to selectively couple the first voltage source and the anode of the diode through one or more resistors that control the bleed current through the laser diode for mitigating silicon breakdown of the laser diode driver.

16. The system of claim 15, wherein the bleed resistor circuit comprises a transistor, a first bleed resistor, and a second bleed resistor, the transistor having a gate, a source, and a drain, wherein the gate functions as the control input, the source coupled to the first voltage source, the drain coupled to a first contact of a first resistor, wherein a second contact of the first resistor is coupled to the anode of the laser diode, the second contact of the first resistor is also coupled to a first contact of a second resistor, wherein a second contact of the second resistor is coupled to the voltage source supply, wherein the first resistor and the second resistor have resistance values for controlling the bleed current through the laser diode to a predetermined current range when the control signal is activated by the overvoltage detector circuit.

17. The system of claim 15, wherein the predetermined voltage difference is based on at least one of a color of the laser diode, a fabrication process of the laser diode driver, or a preferred operating mode.

18. The system of claim 15, wherein the predetermined voltage difference is based on a type of laser diode, wherein the type of laser diode is based on a color of a laser light emitted from the laser diode.

19. The system of claim 15, wherein the predetermined voltage difference is based on a type of laser diode, wherein the type of laser diode indicates a fabrication process used to determine size and spacing features of silicon of the laser diode driver.

20. The system of claim 15, wherein the predetermined voltage difference is based on an operating mode indicating that the bleed current is to be maintained above the threshold current or that the bleed current is to be maintained below the threshold current.

\* \* \* \* \*